US009754845B2

(12) United States Patent
Liu

(10) Patent No.: US 9,754,845 B2
(45) Date of Patent: *Sep. 5, 2017

(54) SYSTEMS AND METHODS FOR CHEMICAL MECHANICAL PLANARIZATION WITH PHOTO-CURRENT DETECTION

(71) Applicant: Taiwan Semiconductor Manufacturing Company Limited, Hsinchu (TW)

(72) Inventor: I-Shuo Liu, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 29 days.

This patent is subject to a terminal disclaimer.

(21) Appl. No.: 14/855,466

(22) Filed: Sep. 16, 2015

(65) Prior Publication Data
US 2016/0005619 A1 Jan. 7, 2016

Related U.S. Application Data

(63) Continuation of application No. 14/097,400, filed on Dec. 5, 2013, now Pat. No. 9,153,452.

(51) Int. Cl.
H01L 21/304 (2006.01)
H01L 21/66 (2006.01)
B24B 37/013 (2012.01)
H01L 21/3105 (2006.01)

(52) U.S. Cl.
CPC ........... *H01L 22/24* (2013.01); *B24B 37/013* (2013.01); *H01L 21/31053* (2013.01); *H01L 22/14* (2013.01); *H01L 22/26* (2013.01)

(58) Field of Classification Search
CPC .................................. C09G 1/00; H01L 21/304
See application file for complete search history.

(56) References Cited

U.S. PATENT DOCUMENTS

| 5,624,300 A * | 4/1997 | Kishii | B24B 37/013 451/285 |
| 9,153,452 B2 * | 10/2015 | Liu | H01L 22/26 |
| 9,165,778 B2 * | 10/2015 | Liu | H01L 21/30625 |
| 2003/0022502 A1 * | 1/2003 | Matsui | C09G 1/02 438/692 |
| 2014/0004626 A1 * | 1/2014 | Xu | H01L 21/302 438/5 |

OTHER PUBLICATIONS

Gratzel, Michael; Dye-sensitized Solar Cells; Journal of Photochemistry and Photobiology, 4; pp. 145-153; 2003.
(Continued)

Primary Examiner — Mohammad Choudhry
(74) Attorney, Agent, or Firm — Jones Day

(57) ABSTRACT

A method includes performing a chemical-mechanical planarization (CMP) on an article, providing a polishing fluid capable of transferring charges to the article, and detecting a current generated in response to the charges transferred to the article. An apparatus that is capable of performing the method and a system that includes the apparatus are also disclosed.

20 Claims, 6 Drawing Sheets

(56) References Cited

OTHER PUBLICATIONS

Lin, Yu-Ting, Zeng, Tsung-Wei, Lai, Wei-Zong, Chen, Chun-Wei, Lin, Yun-Yue, Chang, Yu-Sheng, Su, Wei-Fang; Efficient Photoinduced Charge Transfer in TiO2 Nanorod/Conjugated Polymer Hybrid Materials; Institute of Physics Publishing, Nanotechnology, 17; pp. 5781-5785; 2006.

Liu, I-Shuo, Lo, Hsi-Hsing, Chien, Chih-Tao, Lin, Yun-Yue, Chen, Chun-Wei, Chen, Yang-Fang, Su, Wei-Fang, Liou, Sz-Chian; Enhancing Photoluminescence Quenching and Photoelectric Properties of CdSe Quantum Dots with Hole Accepting Ligands; Journal of Materials Chemistry, 18; pp. 675-682; 2008.

Liu, I-Shuo et al.; U.S. Appl. No. 14/083,818 Specification: Systems and Methods for Chemical Mechanical Planarization with Fluorescence Detection; filed Nov. 19, 2013.

Liu, I-Shuo et al.; U.S. Appl. No. 14/083,818 Drawings: Systems and Methods for Chemical Mechanical Planarization with Fluorescence Detection; filed Nov. 19, 2013.

Robel, Istvan, Subramanian, Vaidyanathan, Kuno, Masaru, Kamat, Prashant; Quantum Dot Solar Cells: Harvesting Light Energy with CdSe Nanocrystals Molecularly Linked to Mesoscopic TiO2 Films; Journal of the American Chemical Society, 128(7); pp. 2385-2393; 2006.

\* cited by examiner

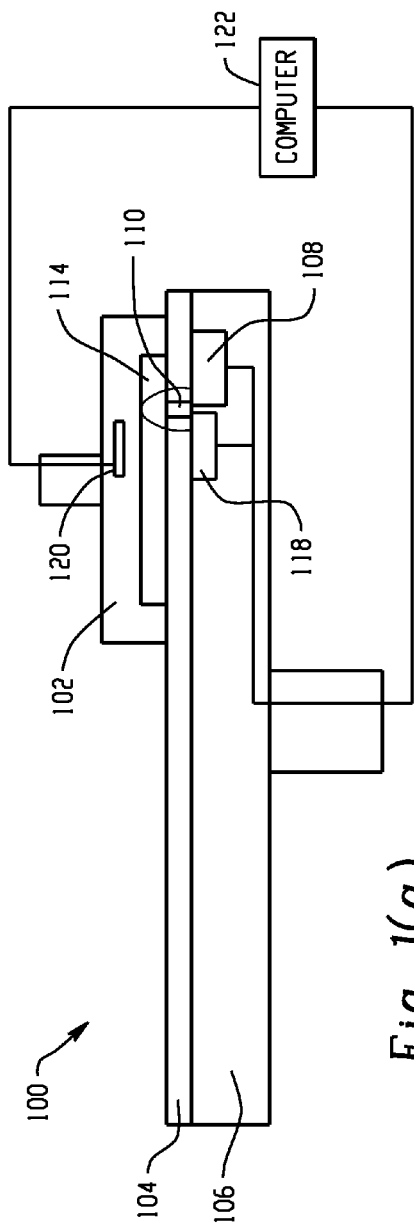
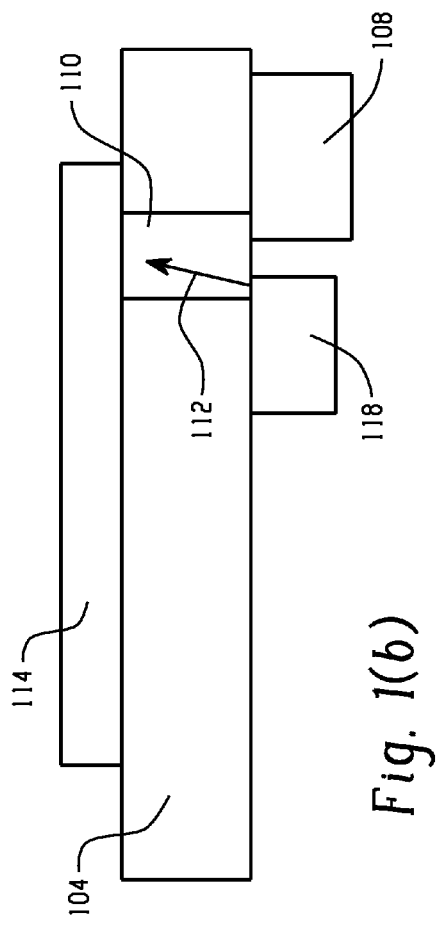
Fig. 1(a)
Fig. 1(b)

US 9,754,845 B2

SYSTEMS AND METHODS FOR CHEMICAL MECHANICAL PLANARIZATION WITH PHOTO-CURRENT DETECTION

CROSS-REFERENCE TO A RELATED APPLICATION

This application is a continuation application of U.S. patent application Ser. No. 14/097,400, filed Dec. 5, 2013, which is incorporated herein by reference in its entirety.

FIELD

The technology described in this disclosure relates generally to material processing and more particularly to planarization.

BACKGROUND

Semiconductor devices fabrication involves many processes, such as chemical-mechanical polishing/planarization (CMP) for planarizing surfaces of a wafer. The CMP process implements a combination of chemical and mechanical forces. For example, the CMP process involves both mechanical grinding and wet etching to generate a smooth surface on a wafer for subsequent processes (e.g., photolithography) in the fabrication of semiconductor devices.

SUMMARY

In accordance with one aspect of the teachings described herein, an apparatus configured to perform a chemical-mechanical planarization (CMP) on an article comprises a polishing head and a current detector. The polishing head is configured to hold the article. The current detector is configured to detect a current generated in response to charges transferred to the article.

In accordance with another aspect of the teachings described herein, a system configured to perform a chemical-mechanical planarization (CMP) on an article comprises a polishing head, a polishing fluid, and a current detector. The polishing head is configured to hold an article. The polishing fluid is capable of transferring charges to the article. The current detector is configured to detect a current generated in response to the charges transferred to the article.

In accordance with yet another aspect of the teachings described herein, a method comprises performing a chemical-mechanical planarization (CMP) on an article, providing a polishing fluid capable of transferring charges to the article, and detecting a current generated in response to the charges transferred to the article.

BRIEF DESCRIPTION OF THE DRAWINGS

FIG. 1(a)-FIG. 1(b) depict an example diagram showing a CMP system.

DETAILED DESCRIPTION

Figure 2A:
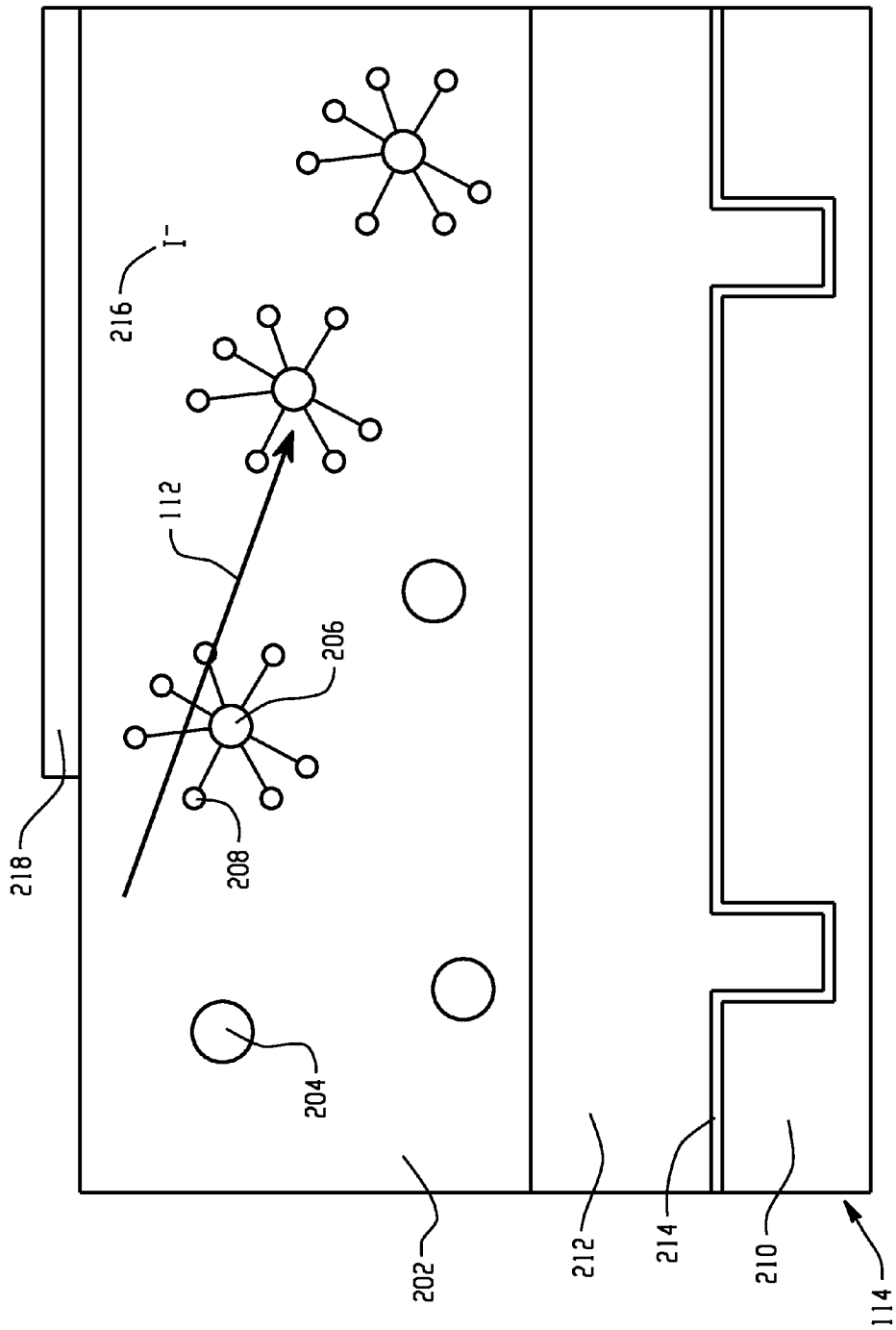
FIG. 2(a) and FIG. 2(b) depict an example diagram showing a polishing fluid including light-absorption particles used in the CMP system as shown in FIG. 1(a) and FIG. 1(b).

Fabrication of semiconductor devices usually includes a CMP process and an etching process. Oftentimes, a thin nitride layer is used as a CMP stop layer for the CMP process and/or an etching hard mask for the etching process that follows the CMP process. When the CMP stop layer (e.g., titanium nitride, titanium oxide) is exposed, the CMP process is usually supposed to stop. However, it is hard to accurately control the end point of the CMP process. The thin CMP stop layer may be completely removed during the CMP process and layers under the CMP stop layer cannot be protected during the subsequent etching process.

FIG. 1(a)-FIG. 1(b) depict an example diagram showing a CMP system. The CMP system 100 is configured to perform a CMP process with photo-current detection so that the CMP process stops with accuracy when a CMP stop layer (e.g., titanium nitride, titanium oxide) is exposed.

As shown in FIG. 1(a) and FIG. 1(b), the CMP system 100 includes a polishing head 102, a polishing pad 104, a platen 106, and a photo-current detector 108. A polishing fluid (not shown) used for the CMP process includes light-absorption particles that are capable of transferring charges (e.g., electrons or holes) to a CMP stop layer included in a wafer 114 in response to an incident light 112 (e.g., from a light source 118). The photo-current detector 108 is configured to detect a photo-current generated as a result of the charge transfer. Upon the detection of the photo-current (e.g., the intensity of the photo-current exceeding a threshold), the CMP process is stopped.

Specifically, one or more small windows 110 in the polishing pad 104 allow the incident light 112 to pass through and fall on the wafer 114 that includes the CMP stop layer (e.g., titanium nitride, titanium oxide). Once the CMP stop layer is exposed during the CMP process, the light-absorption particles begin to transfer charges (e.g., electrons or holes) to the CMP stop layer in response to the incident light 112. For example, the windows 110 are fabricated using one or more materials that are approximately transparent to the incident light 112.

The CMP system 100 further includes a polish-head-rotation controller 120 and a computer 122. For example, the polish-head-rotation controller 120 is configured to control the polishing head 102 to rotate and oscillate to bring the wafer 114 into contact with the polishing pad 104 that moves in the plane of the wafer surface to be planarized (e.g., together with the platen 106). The computer 122 is configured to control the light source 118 and/or the photo-current detector 108. As an example, the computer 122 compares the detected intensity of the photo-current with a predetermined threshold, and causes the polish-head-rotation controller 120 to stop the polishing head 102 if the detected current intensity is larger than the predetermined threshold. In certain embodiments, the polishing pad 104 is made of stacks of soft and hard materials (e.g., porous polymeric materials). As an example, the photo-current detector 108 is connected to an electrode in contact with the polishing fluid, as shown in FIG. 2(a) and FIG. 2(b).

Figure 2B:
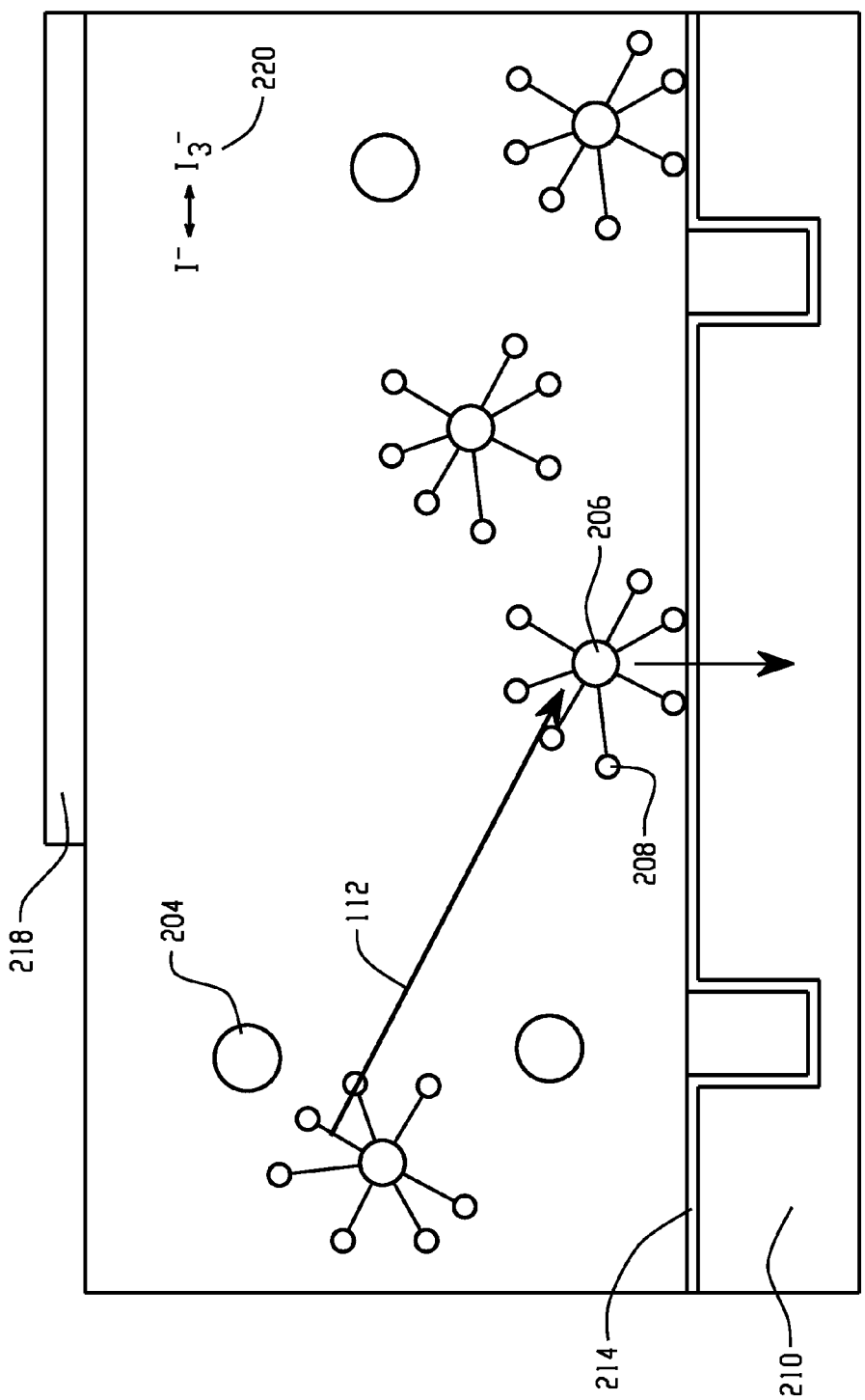

FIG. 2(a) and FIG. 2(b) depict an example diagram showing a polishing fluid including light-absorption particles used in the CMP system 100. The polishing fluid 202 includes an abrasive and corrosive chemical slurry (e.g., a colloid). For example, the polishing fluid 202 includes one or more abrasive materials 204, and a plurality of light-absorption particles 206 capable of generating charges (e.g., electrons or holes) in response to the incident light 112 and attaching to a CMP stop layer 214 in the wafer 114. Further, the polishing fluid 202 includes one or more electrolyte particles 216 (e.g., I⁻ ions) for conducting a current through an electrode 218 which is connected to the photo-current detector 108. The wafer 114 includes multiple layers on a substrate 210. One or more material layers 212 (e.g., silicon oxide) are formed on the CMP stop layer 214. For example, the CMP stop layer 214 includes titanium oxide or titanium nitride.

At the beginning of the CMP process, the CMP stop layer 214 is covered by the material layers 212, and the light-absorption particles 206 are not attached to the CMP stop layer 214. For example, the photo-current detector 108 detects no current or a current with low intensity (e.g., below a threshold) through the electrode 218. As the CMP process continues, the material layers 212 formed on the CMP stop layer 214 are removed, and at least part of the CMP stop layer 214 is exposed. The light-absorption particles 206 begin to attach to the CMP stop layer 214, as shown in FIG. 2(b). Charges (e.g., electrons or holes) are transferred from the light-absorption particles 206 to the CMP stop layer 214. The photo-current detector 108 detects a current or an intensity increase of the current, and the CMP process is stopped when the intensity of the current becomes larger than a threshold.

Each of the light-absorption particles 206 includes one or more surfactant particles 208 that can attach to the CMP stop layer 214. For example, the light-absorption particles 206 include CdS, CdSe, CdTe, ZnO, ZnS, ZnSe, ZnTe, InAs, InN, InP, GaN, GaP, GaAs, AlP, or other suitable materials. The abrasive materials 204 include silica or other suitable materials. The surfactant particles 208 include organic molecules that contain one or more hydroxyl-based (e.g., —OH) functional groups, one or more carboxyl-based (e.g., —COOH) functional groups, one or more ammonium-ion-based (e.g., —NH⁺) functional groups, one or more sulfonic-acid-based (e.g., —SO₃H) functional groups, or other suitable functional groups. As an example, the electrolyte particles (e.g., I⁻ ions) 216 combine to form particles 220 (e.g., I₃⁻ ions) as a result of the charge transfer between the light-absorption particles 206 and the CMP stop layer 214.

Figure 3A:
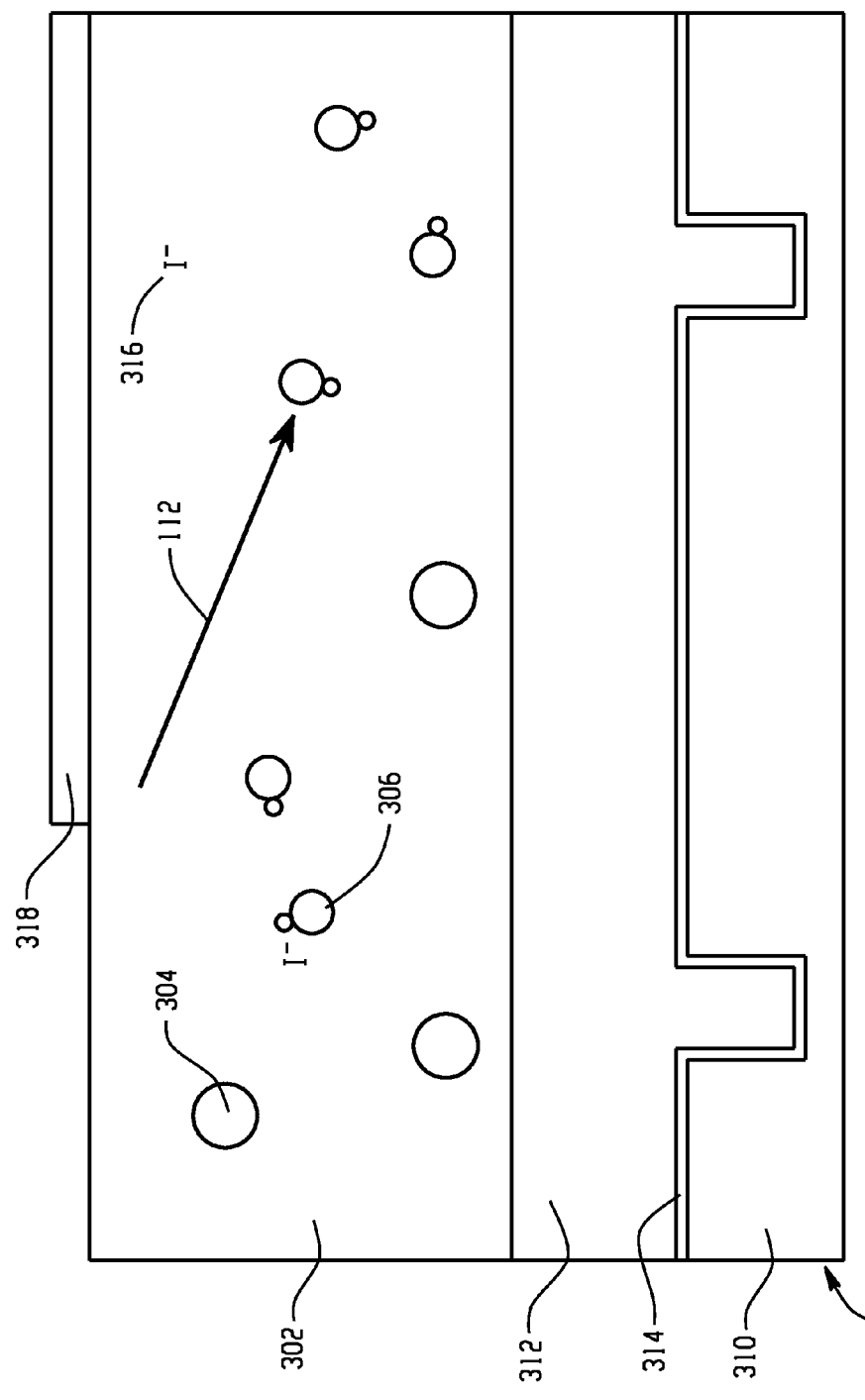
FIG. 3(a) and FIG. 3(b) depict another example diagram showing a polishing fluid including light-absorption particles used in the CMP system as shown in FIG. 1(a) and FIG. 1(b).
Figure 3B:
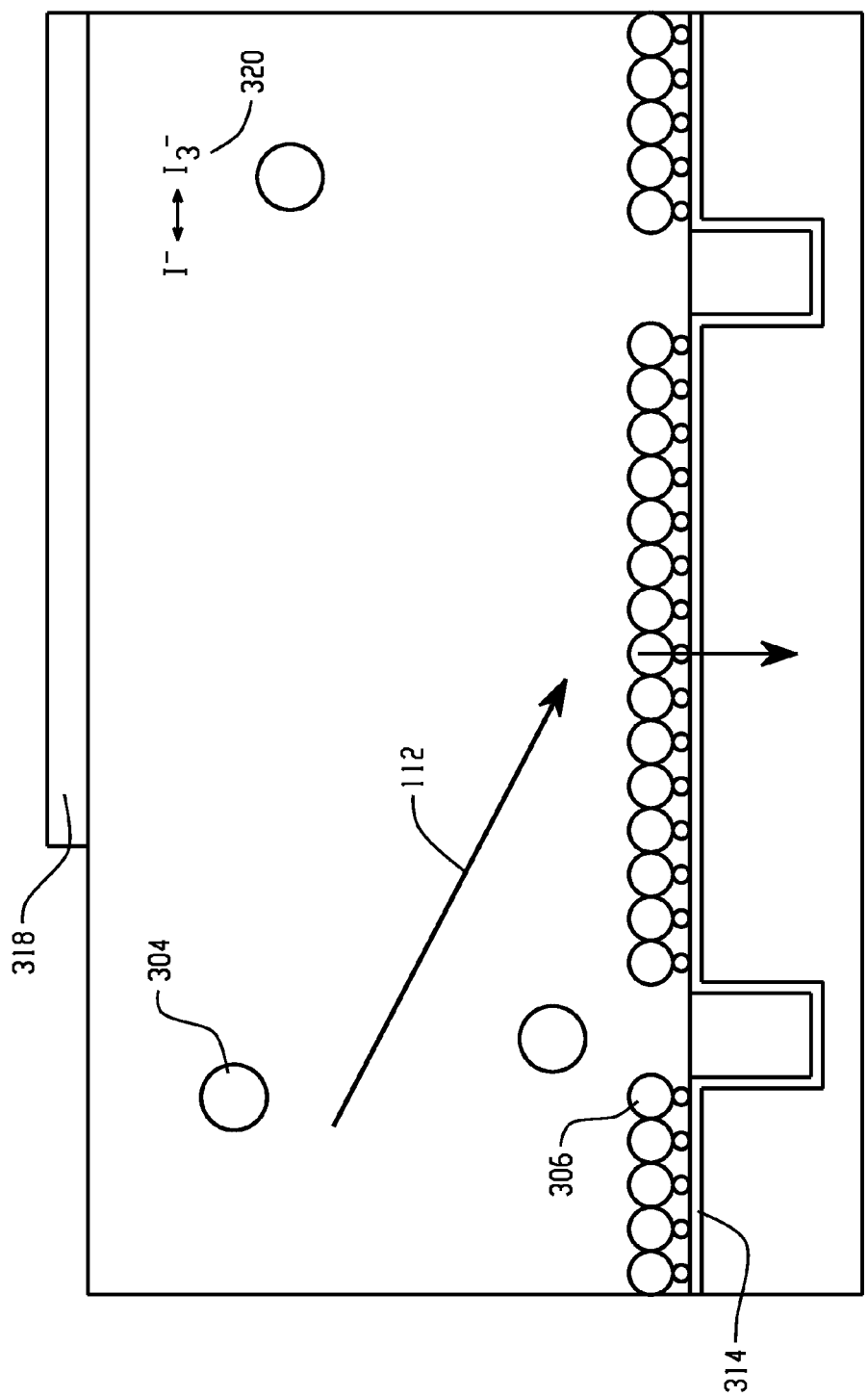

FIG. 3(a) and FIG. 3(b) depict another example diagram showing a polishing fluid including light-absorption particles used in the CMP system 100. The polishing fluid 302 includes one or more abrasive materials 304, and a plurality of light-absorption particles 306 capable of generating charges (e.g., electrons or holes) in response to the incident light 112 and attaching to a CMP stop layer 314 (e.g., titanium oxide, titanium nitride) included in the wafer 114. Further, the polishing fluid 302 includes one or more electrolyte particles 316 (e.g., I⁻ ions) for conducting a current through an electrode 318 which is connected to the photo-current detector 108. In some embodiments, one or more material layers 312 (e.g., silicon oxide) are formed on the CMP stop layer 314.

During the CMP process, the material layers 312 formed on the CMP stop layer 314 are removed, and at least part of the CMP stop layer 314 is exposed. The light-absorption particles 306 begin to attach to the CMP stop layer 314, as shown in FIG. 3(b). Charges (e.g., electrons or holes) are transferred from the light-absorption particles 306 to the CMP stop layer 314. The photo-current detector 108 detects a current or an intensity increase of the current. In some embodiments, when most of the light-absorption particles 306 attach to the surface of the CMP stop layer 314, the intensity of the detected current increases significantly, and the CMP process is stopped when the intensity of the detected current exceeds a predetermined threshold.

For example, the light-absorption particles 306 include certain dye materials, such as EBFP, Azunite, GFPuv, and T-sapphire. In another example, the light-absorption particles 306 include certain fluorescence conducting polymer materials, such as MEHPPV and P3HT. The light-absorption particles 306 include organic molecules that contain one or more hydroxyl-based (e.g., —OH) functional groups, one or more carboxyl-based (e.g., —COOH) functional groups, one or more ammonium-ion-based (e.g., —NH⁺) functional groups, one or more sulfonic-acid-based (e.g., —SO₃H) functional groups, or other suitable functional groups. The abrasive materials 304 include silica or other suitable materials. As an example, the electrolyte particles (e.g., I⁻ ions) 316 combine to form particles 320 (e.g., I₃⁻ ions) as a result of the charge transfer between the light-absorption particles 306 and the CMP stop layer 314.

Figure 4:
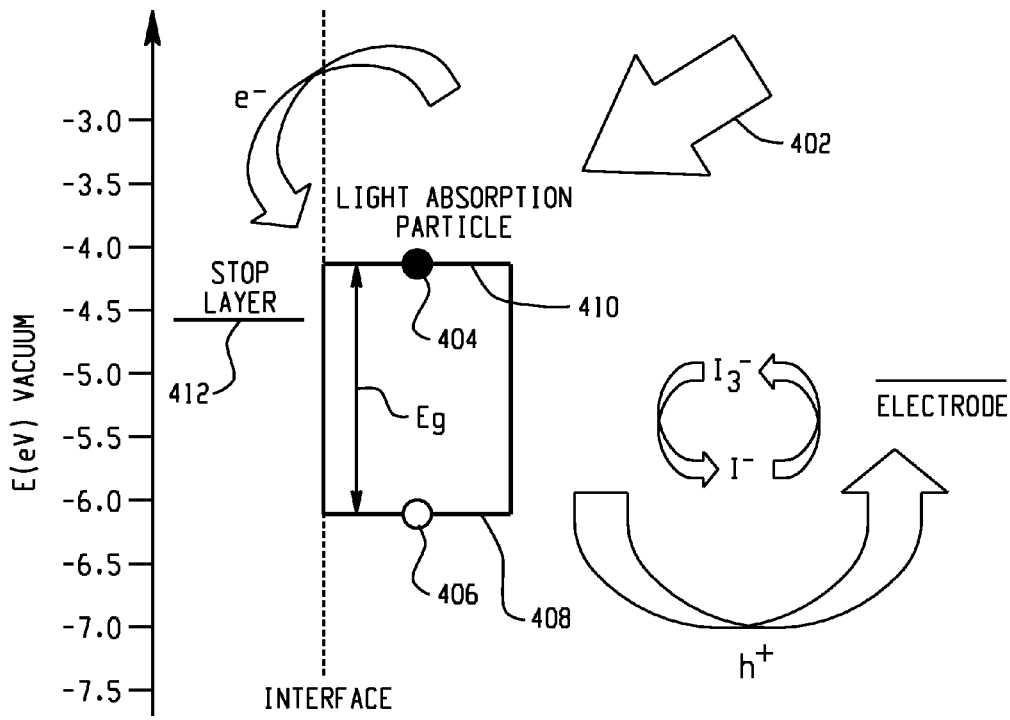
FIG. 4 depicts an example band diagram showing electrons being transferred from a light-absorption particle to a CMP stop layer.

FIG. 4 depicts an example band diagram showing electrons being transferred from a light-absorption particle to a CMP stop layer. As shown in FIG. 4, a light-absorption particle (e.g., the light absorption particles 206 or 306) contained in a polishing fluid (e.g., the polishing fluid 202 or 302) is in contact with a CMP stop layer (e.g., the CMP stop layer 214 or 314). In response to an incident light 402, one or more electrons 404 of the light-absorption particle are excited from a first energy level 408 to a second energy level 410, leaving behind one or more holes 406 at the first energy level 408. The second energy level 410 is higher than an energy level 412 corresponding to a conduction band of the CMP stop layer. The one or more electrons 404 flow from the light-absorption particle to the CMP stop layer, and the one or more holes 406 flow from the light-absorption particle to an electrode (e.g., the electrode 218 or 318) through one or more electrolyte particles (e.g., I⁻ ions or I₃⁻ ions) included in the polishing fluid for photo-current detection.

In some embodiments, the energy of the incident light is larger than a difference between the first energy level 408 and the second energy level 410 which corresponds to a band gap of the light-absorption particle (e.g., Eg). For example, the first energy level 408 is at about −6.0 eV, and the second energy level 410 is at about −4.0 eV. The energy level 412 of the CMP stop layer is at about −4.5 eV. As an example, certain electrolyte particles (e.g., I⁻ ions) combine to form other electrolyte particles (e.g., I₃⁻ ions) as a result of the charge transfer between the light-absorption particle and the CMP stop layer.

Figure 5:
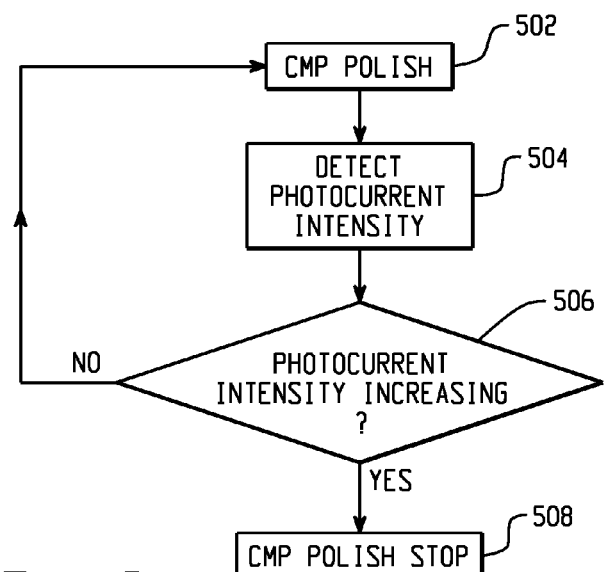
FIG. 5 depicts an example flow chart for performing CMP on an article.

FIG. 5 depicts an example flow chart for performing CMP on an article. At 502, the CMP process begins on an article (e.g., a wafer) including a CMP stop layer. A polishing fluid that is used for the CMP process includes a plurality of light-absorption particles capable of generating charges (e.g., electrons or holes) in response to an incident light and attaching to the CMP stop layer included in the article. Once the light-absorption particles attach to the CMP stop layer, the charges (e.g., electrons or holes) transfer from the light-absorption particles to the CMP stop layer. At 504, a photo-current resulting from the charge transfer from the light-absorption particles to the CMP stop layer is detected. At 506, a determination whether the intensity of the detected photo-current is increasing (e.g., becoming larger than a threshold) is made. If the intensity of the photo-current is increasing (e.g., becoming larger than a threshold), it indicates that at least a large part of the CMP stop layer is exposed. The CMP process ends to avoid removing the CMP stop layer, at 508. Otherwise, the CMP process continues.

For example, the light-absorption particles include CdS, CdSe, CdTe, ZnO, ZnS, ZnSe, ZnTe, InAs, InN, InP, GaN, GaP, GaAs, AlP, EBFP, Azunite, GFPuv, T-sapphire, MEH-PPV, P3HT, or other suitable materials. In some embodiments, the light-absorption particles include surfactant particles capable of attaching to the stop layer. As an example, the surfactant particles include organic molecules that contain one or more hydroxyl-based functional groups, one or more carboxyl-based functional groups, one or more ammonium-ion-based functional groups, one or more sulfonic-acid-based functional groups, or other suitable functional groups.

This written description uses examples to disclose embodiments of the disclosure, include the best mode, and also to enable a person of ordinary skill in the art to make and use various embodiments of the disclosure. The patentable scope of the disclosure may include other examples that occur to those of ordinary skill in the art. One of ordinary skill in the relevant art will recognize that the various embodiments may be practiced without one or more of the specific details, or with other replacement and/or additional methods, materials, or components. Further, persons of ordinary skill in the art will recognize various equivalent combinations and substitutions for various components shown in the figures.

Well-known structures, materials, or operations may not be shown or described in detail to avoid obscuring aspects of various embodiments of the disclosure. Various embodiments shown in the figures are illustrative example representations and are not necessarily drawn to scale. Particular features, structures, materials, or characteristics may be combined in any suitable manner in one or more embodiments. The present disclosure may repeat reference numerals and/or letters in the various examples, and this repetition is for the purpose of simplicity and clarity and does not in itself dictate a relationship between the various embodiments and/or configurations discussed. Various additional layers and/or structures may be included and/or described features may be omitted in other embodiments. For example, a particular layer described herein may include multiple components which are not necessarily connected physically or electrically. Various operations may be described as multiple discrete operations in turn, in a manner that is most helpful in understanding the disclosure. However, the order of description should not be construed as to imply that these operations are necessarily order dependent. In particular, these operations need not be performed in the order of presentation. Operations described herein may be performed in a different order, in series or in parallel, than the described embodiments. Various additional operations may be performed and/or described. Operations may be omitted in additional embodiments.

This written description and the following claims may include terms, such as top, on, under, etc. that are used for descriptive purposes only and are not to be construed as limiting. The embodiments of a device or article described herein can be manufactured, used, or shipped in a number of positions and orientations. For example, the term "on" as used herein (including in the claims) may not necessarily indicate that a first layer/structure "on" a second layer/structure is directly on or over and in immediate contact with the second layer/structure unless such is specifically stated; there may be one or more third layers/structures between the first layer/structure and the second layer/structure. The term "under" as used herein (including in the claims) may not indicate that a first layer/structure "under" a second layer/structure is directly under and in immediate contact with the second layer/structure unless such is specifically stated; there may be one or more third layers/structures between the first layer/structure and the second layer/structure. The term "substrate" used herein (including in the claims) may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials).

What is claimed is:

1. A system for performing chemical-mechanical planarization (CMP) on an article using polishing fluid, comprising:
    a polishing fluid in contact with the article, the polishing fluid comprising light absorbing particles; and
    a current detector for detecting a current caused by a transfer of charges to the article from the light absorbing particles in the polishing fluid in response to light incident on the polishing fluid.

2. The apparatus of claim 1, further comprising an electrode connected to the current detector, configured to conduct the current, and via which the current detector detects the current.

3. The apparatus of claim 1, further comprising:
    a polishing head configured to hold the article;
    a polish-head-rotation controller coupled to and operable so as to control the operation of the polishing head; and
    a computer coupled to the current detector and the polish-head-rotation controller and configured to compare the current detected by the current detector with a threshold and to control the operation of the polish-head-rotation controller based on the result of the comparison.

4. The apparatus of claim 3, wherein the computer is further configured to cause the polish-head-rotation controller to stop the operation of the polishing head when it is determined that the current detected by the current detector is larger than the threshold.

5. The apparatus of claim 1, further comprising a light source configured to emit a light incident on the polishing fluid.

6. The apparatus of claim 5, further comprising:
    a polishing head configured to hold the article;
    a polishing pad disposed between the light source and the polishing head; and
    a window in the polishing pad through which the light source emits the light incident on the polishing fluid.

7. A system configured to perform a chemical-mechanical planarization (CMP) on an article, comprising:
    a polishing head configured to hold the article;
    a polishing fluid capable of transferring charges to the article in response to light incident on the polishing fluid; and
    a current detector configured to detect a current generated in response to the transfer of charges from the polishing fluid to the article.

8. The system of claim 7, wherein the polishing fluid includes light-absorption particles.

9. The system of claim 8, wherein the light-absorption particles include surfactant particles.

10. The system of claim 7, wherein the polishing fluid includes electrolyte particles.

11. The system of claim 10, wherein the electrolyte particles include at least one of $I^-$ ions and $I_3^-$ ions.

12. The system of claim 7, further comprising an electrode connected to the current detector, configured to conduct the current, via which the current detector detects the current, and in contact with the polishing fluid.

13. The system of claim 7, further comprising the article, wherein the article has a CMP stop layer that includes one of titanium oxide and titanium nitride.

14. A method comprising:
performing a chemical-mechanical planarization (CMP) on an article;
providing a polishing fluid capable of transferring charges to the article in response to light incident upon the polishing fluid; and
detecting a current generated in response to the transfer of charges to the article.

15. The method of claim 14, wherein the performing a CMP on an article exposes a CMP stop layer of the article, the method further comprising attaching light-absorption particles of the polishing fluid to the CMP stop layer of the article.

16. The method of claim 15, further comprising emitting a light incident on the polishing fluid, wherein the emitting a light incident on the polishing fluid excites electrons of the light-absorption particles from a first energy level to a second energy level higher than the first energy level and leaves holes of the light-absorption particles at the first energy level.

17. The method of claim 16, wherein the second energy level is higher than an energy level of the CMP stop layer of the article.

18. The method of claim 16, wherein the light incident on the article has an energy level larger than a difference between the first energy level and the second energy level.

19. The method of claim 14, further comprising:
comparing the detected current with a threshold; and
controlling the CMP based on the result of the comparison.

20. The method of claim 19, further comprising, when it is determined that the detected current is larger than the threshold, stopping the CMP.

* * * * *